United States Patent
Buynoski (12)

(10) Patent No.: US 6,194,299 B1
(45) Date of Patent: Feb. 27, 2001

(54) METHOD FOR FABRICATION OF A LOW RESISTIVITY MOSFET GATE WITH THICK METAL ON POLYSILICON

(75) Inventor: Matthew S. Buynoski, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/325,021

(22) Filed: Jun. 3, 1999

(51) Int. Cl.$^7$ ............................................... H01L 21/3205

(52) U.S. Cl. .............................................................. 438/592

(58) Field of Search ..................................... 438/296, 532, 438/533, 586, 299, 233, 592, 759

(56) References Cited

U.S. PATENT DOCUMENTS

| | | | |
|---|---|---|---|
| 4,514,233 | * | 4/1985 | Kawabuchi . |
| 5,656,519 | * | 8/1997 | Mogami . |
| 5,731,239 | * | 3/1998 | Wong et al. . |
| 5,843,834 | * | 12/1998 | Naem . |
| 5,953,612 | * | 9/1999 | Lin et al. . |
| 6,001,697 | * | 12/1999 | Chang et al. . |
| 6,001,698 | * | 12/1999 | Kuroda . |
| 6,022,795 | * | 2/2000 | Chen et al. . |
| 6,074,921 | * | 6/2000 | Lin et al. . |

OTHER PUBLICATIONS

Kittl, et al "A Ti salicide process for 0.10 micron gate length CMOS technology," IEEE 1996 Symp. on VLSI Tech. Dig. of Tech. Papers, p. 14 (1996).*

Yukio Fukuda, Shigeto Kohda, and Yoshitaka Kitano, A New Aluminum Pattern Formation Using Substitution Reaction of Aluminum for Polysilicon and Its Application to MOS Device Fabrication, IEEE Transactions on Electron Devices, vol. Ed–31, No. 6, Jun. 1984, pp. 828–832.

* cited by examiner

Primary Examiner—Richard Booth
(74) Attorney, Agent, or Firm—Monica H. Choi

(57) ABSTRACT

The present invention is a method for fabricating a gate of a MOSFET (Metal Oxide Semiconductor Field Effect Transistor) with the gate having low resistivity. The MOSFET has a drain region, a source region, and a channel region fabricated within a semiconductor substrate, and the MOSFET initially has a gate comprised of silicide on polysilicon disposed on a gate dielectric over the channel region. Generally, the method of the present invention includes a step of depositing a first dielectric layer over the drain region, the source region, and the gate of the MOSFET. The present invention also includes steps of polishing down the first dielectric layer over the drain region and the source region, and of polishing down the first dielectric layer over the gate until the silicide over the polysilicon or the polysilicon of the gate is exposed. The present invention further includes the step of etching away the silicide and a predetermined thickness of the polysilicon if the silicide is exposed and of etching away a predetermined thickness of the polysilicon if the polysilicon is exposed, such that an opening is formed on top of a remaining portion of the polysilicon. In addition, the present invention includes the step of depositing a metal within the opening. In this manner, the gate of the present invention has low resistivity since a relatively thick layer of metal is deposited on the remaining portion of the polysilicon. However, with the present invention, the remaining portion of the polysilicon has a sufficient thickness such that a threshold voltage of the MOSFET is not substantially affected by the metal disposed on top of the remaining portion of the polysilicon.

11 Claims, 3 Drawing Sheets

METHOD FOR FABRICATION OF A LOW RESISTIVITY MOSFET GATE WITH THICK METAL ON POLYSILICON

TECHNICAL FIELD

This invention relates to MOSFETs (Metal Oxide Semiconductor Field Effect Transistors), and more particularly to a method for fabricating a MOSFET gate with relatively thick metal on polysilicon for a gate with low resistivity.

BACKGROUND OF THE INVENTION

Referring to FIG. 1, a cross sectional view of a conventional MOSFET (Metal Oxide Semiconductor Field Effect Transistor) 100 includes a drain region 102, a source region 104, and a channel region 106 fabricated within a semiconductor substrate 108, as known to one of ordinary skill in the art of electronics. A gate dielectric 110 is disposed over the channel region 106 of the MOSFET 100. The MOSFET 100 also includes a gate comprised of polysilicon 112 disposed over the gate dielectric 110. Spacer structures 113 typically formed of an insulating material surround the gate dielectric 110 and the gate structure over the gate dielectric 110, as known to one of ordinary skill in the art of electronics.

For making contact to the drain region 102, the source region 104, and the polysilicon 112 of the gate, a metal silicide is formed on the drain region 102, the source region 104, and the polysilicon 112 of the gate. A drain silicide 114 is formed on the drain region 102, a source silicide 116 is formed on the source region 104, and a gate silicide 118 is formed on the polysilicon 112 of the gate of the MOSFET 100.

For efficiency in fabrication, the drain silicide 114, the source silicide 116, and the gate silicide 118 are typically fabricated simultaneously in the prior art. During the fabrication of the suicides, the drain region 102, the source region 104, and the polysilicon 112 are exposed, and metal is deposited on those regions. Then, a silicidation anneal is performed, and the drain silicide 114, the source silicide 116, and the gate silicide 118 form from a reaction of the deposited metal with silicon during the silicidation anneal.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, as the dimensions of the MOSFET 100 are scaled down, the depth of diffusion of the drain region 102 and the source region 104 into the semiconductor substrate 108 and the thickness of the polysilicon 112 of the gate are scaled down. Thus, the depth of the drain silicide 114 and the source silicide 116 and the thickness of the gate silicide 118 are also scaled down.

However, such scaling down of the thickness of the gate silicide 118 results in higher resistivity of the gate of the MOSFET 100. Such higher resistivity in turn leads to slower device speed of the MOSFET 100. Nevertheless, scaling down the dimensions of the MOSFET 100 is also advantageous.

Thus, a method is desired for fabricating a gate with low resistivity within such a MOSFET with scaled down dimensions.

SUMMARY OF THE INVENTION

Accordingly, the present invention is a method for fabricating a gate of a MOSFET (Metal Oxide Semiconductor Field Effect Transistor) with the gate having low resistivity. The MOSFET has a drain region, a source region, and a channel region fabricated within a semiconductor substrate, and the MOSFET initially has a gate comprised of silicide on polysilicon disposed on a gate dielectric over the channel region. Generally, the method of the present invention includes a step of depositing a first dielectric layer over the drain region, the source region, and the gate of the MOSFET. The present invention also includes steps of polishing down the first dielectric layer over the drain region and the source region, and of polishing down the first dielectric layer over the gate until the silicide on the polysilicon or the polysilicon of the gate is exposed. The present invention further includes the step of etching away the silicide on the polysilicon and a predetermined thickness of the polysilicon if the silicide on the polysilicon is exposed or etching away a predetermined thickness of the polysilicon if the polysilicon is exposed, such that an opening is formed on top of a remaining portion of the polysilicon. The opening has at least one sidewall of an insulating material and a bottom wall of the remaining portion of the polysilicon. In addition, the present invention includes the steps of depositing a metal within the opening and over the first dielectric layer and of polishing down the deposited metal such that the metal is polished away from the first dielectric layer with the metal being contained within the opening.

In this manner, the gate of the present invention has low resistivity since a relatively thick layer of metal is deposited on the remaining portion of the polysilicon. However, with the present invention, the remaining portion of the polysilicon has a sufficient thickness such that a threshold voltage of the MOSFET is not significantly affected by the metal disposed on top of the remaining portion of the polysilicon. The present invention may be used to particular advantage for fabricating a gate with low resistivity for a MOSFET with scaled down dimensions.

These and other features and advantages of the present invention will be better understood by considering the following detailed description of the invention which is presented with the attached drawings.

The figures referred to herein are drawn for clarity of illustration and are not necessarily drawn to scale. Moreover, the figures referred to herein show a MOSFET that is typically part of a larger integrated circuit. Elements having the same reference number in FIGS. 1, 2, 3, 4, 5, 6, 7, 8, and 9 refer to elements having similar structure and function.

DETAILED DESCRIPTION

Figure 1:
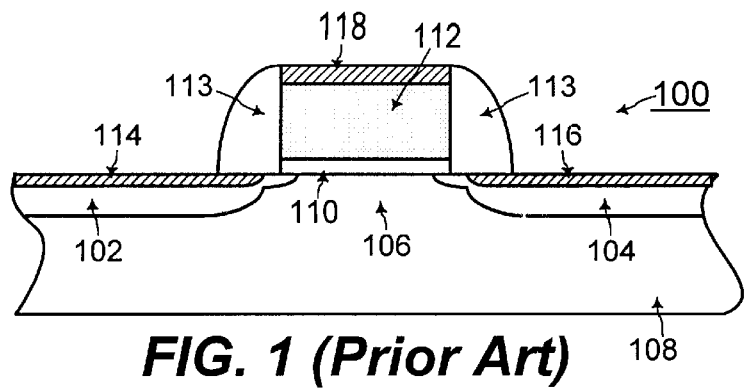
FIG. 1 shows a cross sectional view of a conventional MOSFET of the prior art.
Figure 2:
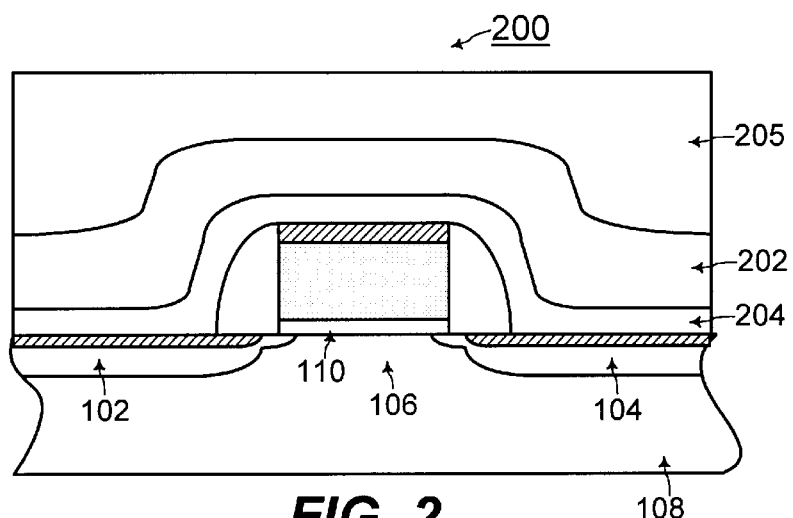
FIG. 2 shows a cross sectional view of a MOSFET of the present invention, with deposition of a first dielectric layer for fabricating a gate with low resistivity, according to an embodiment of the present invention.

Referring to FIG. 2, the method for fabricating a gate with low resistivity for a MOSFET 200 of the present invention includes the step of depositing a first dielectric layer 202 over the surfaces of the semiconductor substrate 108. The MOSFET 200 has device regions that are similar to the device regions of the MOSFET 100 of FIG. 1 with the same reference number. The first dielectric layer 202 is comprised of a dielectric material such as silicon dioxide. The first dielectric layer 202 is deposited over the drain region 102, the source region 104, and the gate of the MOSFET 200.

Referring to FIG. 2, in an alternative embodiment of the present invention, a dielectric etch stop layer 204 may be deposited before the first dielectric layer 202 is deposited. The dielectric etch stop layer 204 may be needed for subsequent fabrication steps after the fabrication of the low resistivity gate of the present invention. The dielectric etch stop layer 204 may be comprised of silicon oxynitride for example. However, the present invention may be practiced without deposition of the dielectric etch stop layer 204 and with deposition of only the first dielectric layer 202, as would be apparent to one of ordinary skill in the art of integrated circuit fabrication from the description herein. Processes for deposition of the dielectric material of the first dielectric layer 202 and the dielectric etch stop layer 204 are known to one of ordinary skill in the art of integrated circuit fabrication.

Figure 3:
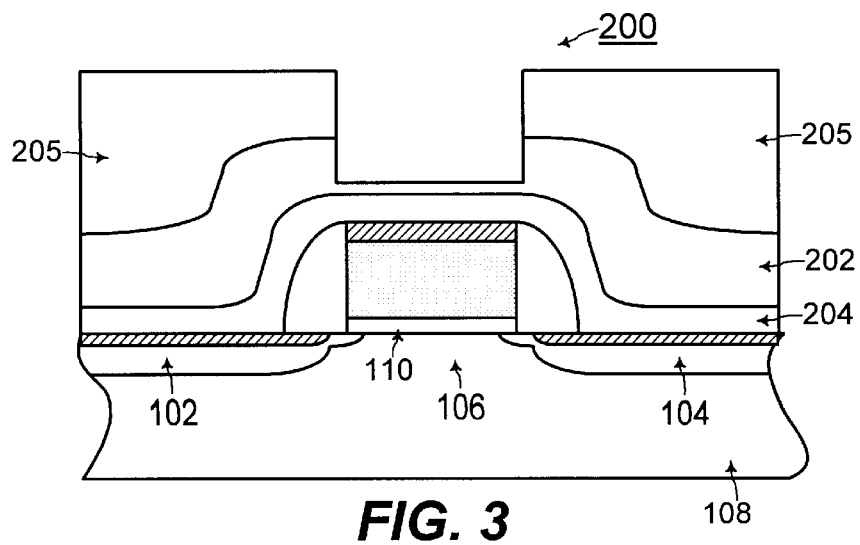
FIG. 3 shows a cross sectional view of the MOSFET of FIG. 2, with patterning and etching of the first dielectric layer of FIG. 2 for reverse planarization of the first dielectric layer before polishing of the first dielectric layer, according to an embodiment of the present invention.

Referring to FIGS. 2 and 3, a photoresist layer 205 is deposited over the first dielectric layer 202. The photoresist layer 205 is patterned with a masking step to etch the first dielectric layer 202 over the gate of the MOSFET 202 as shown in FIG. 3. The photoresist layer 205 is then removed before a subsequent polishing of the first dielectric layer 202.

Such a patterning and etching of the first dielectric layer 202 is a reverse planarization process that creates peaks in the first dielectric layer 202 which is amenable for the subsequent polishing of the first dielectric layer 202. Processes for thus patterning and etching a portion of the first dielectric layer 202 are known to one of ordinary skill in the art of integrated circuit fabrication. In an alternative embodiment of the present invention, this patterning and etching of the first dielectric layer 202 may not be performed before the subsequent polishing of the first dielectric layer 202.

Figure 4:
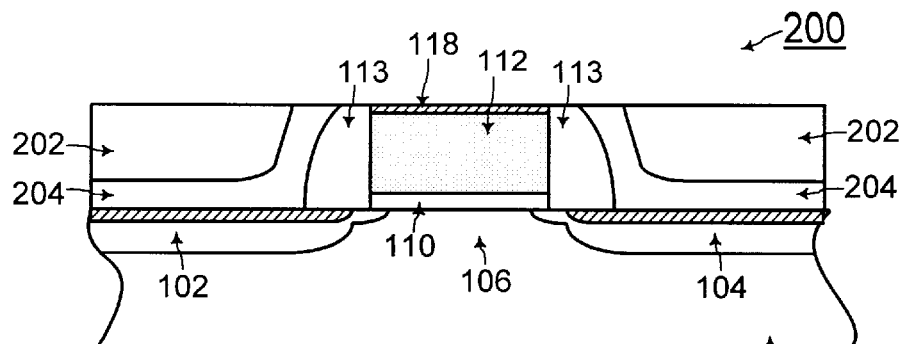
FIG. 4 shows a cross sectional view of the MOSFET of FIG. 3, with polishing down of the first dielectric layer until the silicide over the polysilicon or the polysilicon over the gate dielectric of the MOSFET is exposed, according to an embodiment of the present invention.

Referring to FIG. 4, the top surface of the structures on the semiconductor substrate 108 of FIG. 3 is polished down. Thus, the first dielectric layer 202 over the drain region 102 and the source region 104 is polished down. In addition, referring to FIGS. 1 and 4, the first dielectric layer 202 over the gate of the MOSFET 200 is polished down until the gate silicide 118 is exposed. Alternatively, the present invention may be practiced when the first dielectric layer 202 and the gate silicide 118 are further polished down until the polysilicon 112 is exposed. Processes for thus polishing the top surface of the structures on the semiconductor substrate 108, such as chemical mechanical polishing, are known to one of ordinary skill in the art of integrated circuit fabrication.

Figure 5:
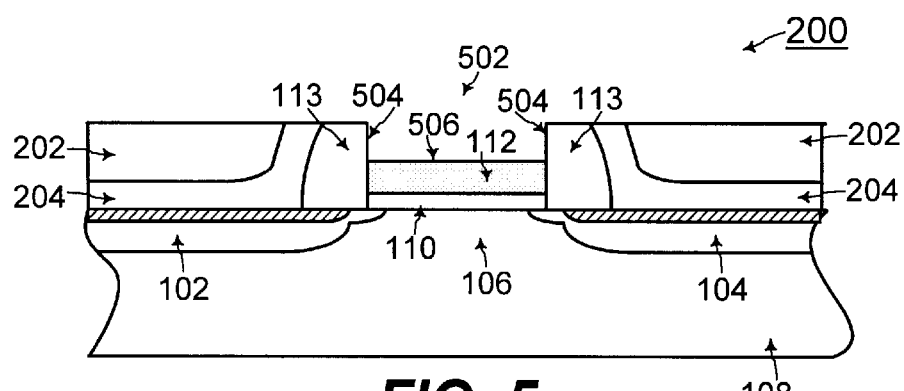
FIG. 5 shows a cross sectional view of the MOSFET of FIG. 4, with etching away of the silicide on the polysilicon and a predetermined thickness of the polysilicon or just a predetermined thickness of the polysilicon, such that an opening is formed on top of a remaining portion of the polysilicon, according to an embodiment of the present invention.

Referring to FIG. 5, the gate silicide 118 and a predetermined thickness of the polysilicon 112 are etched away such that an opening 502 is formed on top of a remaining portion of the polysilicon 112. If the gate silicide 118 were already polished away, then a predetermined thickness of the polysilicon 112 is etched away to form the opening 502 on top of the remaining portion of the polysilicon 112. The opening 502 has at least one sidewall 504 of an insulating material such as the insulating material of the spacers 113. The opening 502 also has a bottom wall 506 of the remaining portion of the polysilicon 112. Processes for thus selectively etching the gate silicide 118 or a predetermined thickness of the polysilicon 112, as shown in FIG. 5, are known to one of ordinary skill in the art of integrated circuit fabrication.

Referring to FIG. 5, with the remaining portion of the polysilicon 112 exposed, in one embodiment of the present invention, the remaining portion of the polysilicon 112 may be doped using low energy implantation. For example, if the MOSFET 200 were an N-channel MOSFET, the remaining portion of the polysilicon 112 may have insufficient dopant resulting in detrimental effects on the threshold voltage of the MOSFET 200 from depletion of the remaining portion of the polysilicon 112. In such a case, the remaining portion of the polysilicon 112 may be doped with an N-type dopant using low energy implantation.

Processes for thus selectively doping the remaining portion of the polysilicon 112 using low energy implantation are known to one of ordinary skill in the art of integrated circuit fabrication.

Figure 6:
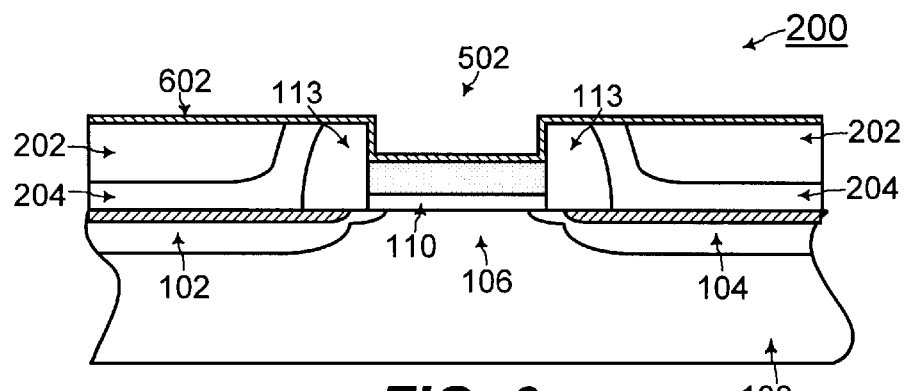
FIG. 6 shows a cross sectional view of the MOSFET of FIG. 5, with deposition of a metal adhesion layer, according to an embodiment of the present invention.

Referring to FIG. 6, a metal adhesion layer 602 may be deposited on the exposed surfaces on top of the semiconductor wafer 108. The metal adhesion layer 602 enhances adhesion between metal to be deposited into the opening 502 and the remaining portion of the polysilicon 112. For example, if the metal to be deposited into the opening 502 is tungsten, then the metal adhesion layer 602 is a titanium underlayer. If the metal to be deposited into the opening 502 is platinum, then the metal adhesion layer 602 is also a titanium underlayer.

In addition, the metal adhesion layer 602 disposed between the metal to be deposited into the opening 502 and the remaining portion of the polysilicon 112 may act as a barrier layer that prevents a silicidation reaction between the metal to be deposited into the opening 502 and the remaining portion of the polysilicon 112. Processes for thus depositing the metal adhesion layer 602, as shown in FIG. 6, are known to one of ordinary skill in the art of integrated circuit fabrication. In an alternative embodiment of the present invention, the metal adhesion layer 602 may not be deposited for some types of metals deposited into the opening 502.

Figure 7:
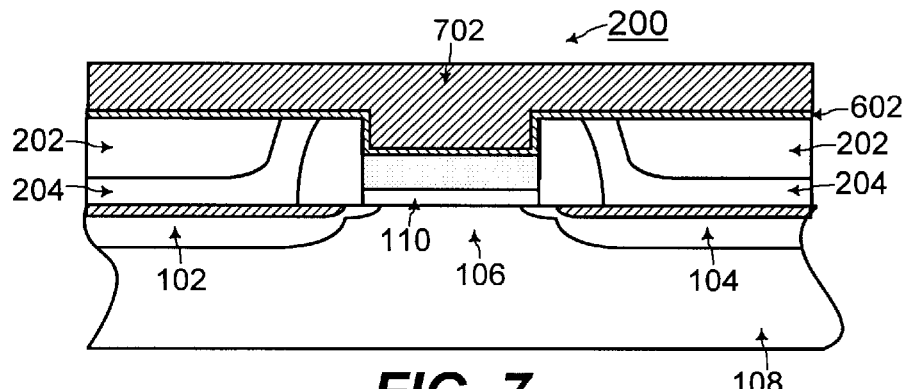
FIG. 7 shows a cross sectional view of the MOSFET of FIG. 6, with deposition of metal on the first dielectric layer and within the opening over the remaining portion of the polysilicon, according to an embodiment of the present invention.

Referring to FIG. 7, a metal 702 is deposited within the opening 502 and over any surrounding dielectric layer including the first dielectric layer 202. The metal 702 is preferably tungsten for a MOSFET with scaled down dimensions. However, aluminum, titanium, and platinum (or any other type of metal amenable for deposition into the opening 502 and having relatively high conductivity) may also be used with the present invention. The metal 702 should preferably not react with the remaining portion of the polysilicon 112 during subsequent integrated circuit fabrication processes. Processes for thus depositing the metal 702, as shown in FIG. 7, are known to one of ordinary skill in the art of integrated circuit fabrication.

Figure 8:
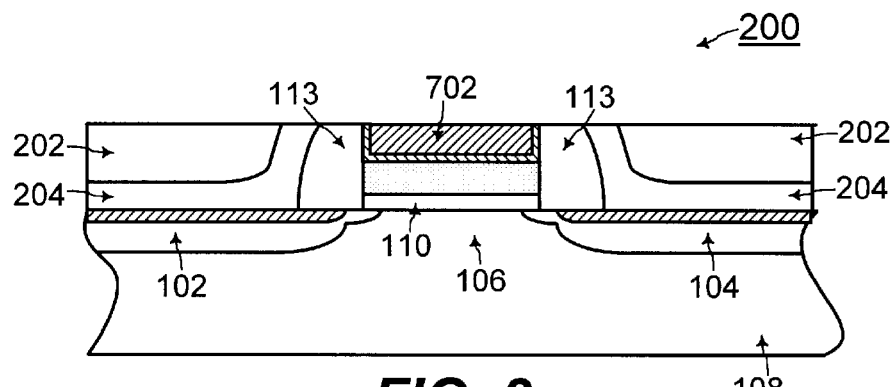
FIG. 8 shows a cross sectional view of the MOSFET of FIG. 7, with polishing down of the deposited metal such that the metal is polished away from the top of the first dielectric layer with the metal being contained within the opening, according to an embodiment of the present invention.

Referring to FIG. 8, the metal 702 is polished down such that the metal 702 is polished away from any dielectric material surrounding the opening 502 including the first dielectric layer 202 and such that the metal 702 is contained within the opening 502. Processes for thus polishing the metal 702, such as chemical mechanical polishing, are known to one of ordinary skill in the art of integrated circuit fabrication.

Figure 9:
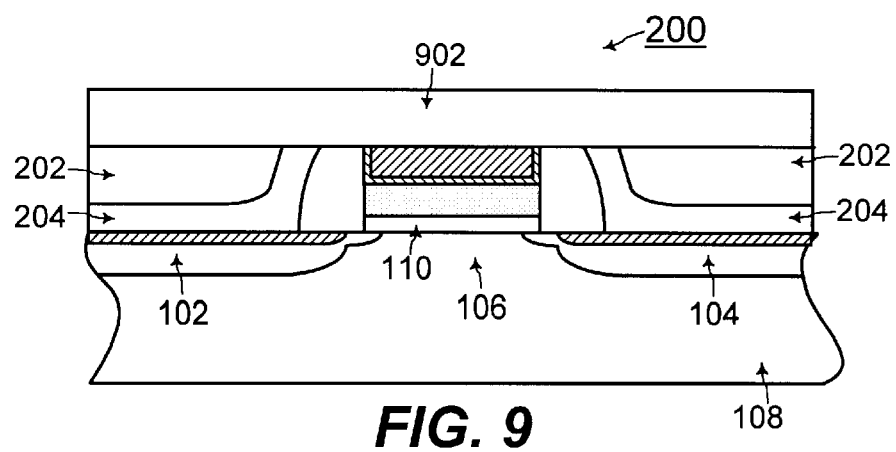
FIG. 9 shows a cross sectional view of the MOSFET of FIG. 8, with deposition of a second dielectric layer over the polished surface before forming metal interconnect to the metal of the MOSFET gate, according to an embodiment of the present invention.

Referring to FIG. 9, a second dielectric layer 902 is deposited over the metal 702 within the opening 502 and over any surrounding dielectric layer including the first dielectric layer 202. The second dielectric layer 902 may be comprised of silicon dioxide, and processes for thus depositing the second dielectric layer 902 are known to one of ordinary skill in the art of integrated circuit fabrication. At this point, after deposition of the second dielectric layer 902, standard integrated circuit fabrication processes are used for forming local metal interconnect to the active device areas of the MOSFET including the metal 702 of the gate of the MOSFET 200.

In this manner, the gate of the MOSFET 200 of the present invention includes a relatively thick layer of the metal 702 disposed over the remaining portion of the polysilicon 112. Thus, because a significant amount of the metal 702 having relatively high conductivity forms the gate of the MOSFET 200 of the present invention, such a gate has low resistivity. However, the remaining portion of the polysilicon 112 still abuts the gate dielectric 110 to preserve the threshold voltage of the MOSFET 200. In addition, the remaining portion of the polysilicon 112 has a sufficient thickness such that a first work function of the remaining portion of the polysilicon 112 over the gate dielectric 110 is not substantially affected by a second work function of the metal 702 on top of the remaining portion of the polysilicon 112. Thus, the threshold voltage of the MOSFET 200 of the present invention is not noticeably altered by the processes of the present invention.

The foregoing is by way of example only and is not intended to be limiting. As will be understood by those skilled in the art, the integrated circuit structures described herein may be made or used in the same way regardless of their position and orientation. Accordingly, it is to be understood that terms and phrases such as "bottom wall," "sidewall," "down," "on," "over," and "top" as used herein refer to the relative location and orientation of various portions of the structures with respect to one another, and are not intended to suggest that any particular absolute orientation with respect to external objects is necessary or required.

The invention is limited only as defined in the following claims and equivalents thereof.

I claim:

1. A method for fabricating a gate of a MOSFET (Metal Oxide Semiconductor Field Effect Transistor) with said gate having low resistivity, said MOSFET having a drain region, a source region, and a channel region fabricated within a semiconductor substrate, and said MOSFET initially having a gate comprised of silicide on polysilicon disposed on a gate dielectric over said channel region, the method including steps of:

A. depositing a first dielectric layer over said drain region, said source region, and said gate;

B. etching away a portion of said first dielectric layer by patterning a photoresist layer deposited on said first dielectric layer to form additional peaks in said first dielectric layer from said etching away of said portion of said first dielectric layer near said gate, and then polishing down said first dielectric layer over said drain region and said source region, and polishing down said first dielectric layer over said gate until one of said silicide on said polysilicon and said polysilicon of said gate is exposed;

C. etching away said silicide on said polysilicon and a predetermined thickness of said polysilicon if said silicide is exposed after said step B, and etching away said predetermined thickness of said polysilicon if said polysilicon is exposed after said step B, such that an opening is formed on top of a remaining portion of said polysilicon, said opening having at least one sidewall of an insulating material and having a bottom wall of said remaining portion of said polysilicon;

D. depositing a metal within said opening and on said first dielectric layer; and E. polishing down said metal deposited in said step D such that said metal is polished away from said first dielectric layer with said metal being contained within said opening.

2. The method of claim 1, further including a step of:
depositing an etch stop layer over said drain region, said source region, and said gate before said step A of depositing said first dielectric layer over said etch stop layer.

3. The method of claim 1, further including a step of:
depositing a second dielectric layer over said first dielectric layer and over said metal contained within said opening, and forming metal interconnect to said metal contained within said opening.

4. The method of claim 1, further including a step of:
implanting dopant into said remaining portion of said polysilicon before said step D of depositing said metal within said opening.

5. The method of claim 1, wherein said metal deposited into said opening is tungsten.

6. The method of claim 1, wherein a metal adhesion layer is deposited on said at least one side wall of said opening and on top of said remaining portion of said polysilicon before said metal is deposited into said opening to enhance adhesion of said metal to said remaining portion of said polysilicon.

7. The method of claim 1, wherein said metal adhesion layer is a barrier layer for preventing a silicidation reaction between said metal and said remaining portion of the polysilicon.

8. The method of claim 1, wherein said metal deposited into said opening is selected from a group consisting of aluminum, titanium, and platinum.

9. The method of claim 8, wherein a titanium underlayer is deposited on said at least one side wall of said opening and on top of said remaining portion of said polysilicon before said metal is deposited into said opening to enhance adhesion of said metal to said remaining portion of said polysilicon when said metal is platinum.

10. The method of claim 1, wherein said remaining portion of said polysilicon has a sufficient thickness such that a threshold voltage of said MOSFET is not substantially affected by said metal disposed on top of said remaining portion of said polysilicon.

11. A method for fabricating a gate of a MOSFET (Metal Oxide Semiconductor Field Effect Transistor) with said gate having low resistivity, said MOSFET having a drain region, a source region, and a channel region fabricated within a semiconductor substrate, and said MOSFET initially having a gate comprised of silicide on polysilicon disposed on a gate dielectric over said channel region, the method including steps of:

A. depositing an etch stop layer over said drain region, said source region, and said gate;

B. depositing a first dielectric layer over said etch stop layer;

C. etching away a portion of said first dielectric layer by patterning a photoresist layer deposited on said first dielectric layer to form additional peaks from said etching away of said portion of said first dielectric layer in said first dielectric layer near said gate;

D. polishing down said first dielectric layer over said drain region and said source region, and polishing down said first dielectric layer over said gate until one of said silicide on said polysilicon and said polysilicon of said gate is exposed;

E. etching away said silicide on said polysilicon and a predetermined thickness of said polysilicon if said silicide is exposed after said step B, and etching away said predetermined thickness of said polysilicon if said polysilicon is exposed after said step B, such that an opening is formed on top of a remaining portion of said polysilicon, said opening having at least one sidewall of an insulating material and having a bottom wall of said remaining portion of said polysilicon;

F. implanting dopant into said remaining portion of said polysilicon;

G. depositing a metal adhesion layer on said at least one side wall of said opening and on top of said remaining portion of said polysilicon;

H. depositing a metal within said opening and on said first dielectric layer;

I. polishing down said metal deposited in said step H such that said metal is polished away from said first dielectric layer with said metal being contained within said opening;

J. depositing a second dielectric layer over said first dielectric layer and over said metal contained within said opening; and K. forming metal interconnect to said metal contained within said opening;

and wherein said remaining portion of said polysilicon has a sufficient thickness such that a threshold voltage of said MOSFET is not substantially affected by said metal disposed on top of said remaining portion of said polysilicon.

* * * * *